United States Patent [19]
Yasumi

[11] Patent Number: 5,923,541
[45] Date of Patent: Jul. 13, 1999

[54] PC CARD CONNECTOR DEVICE

[75] Inventor: Yoshiyuki Yasumi, Iwate-ken, Japan

[73] Assignee: Alps Electric Co., Ltd., Japan

[21] Appl. No.: 08/877,062

[22] Filed: Jun. 17, 1997

[30] Foreign Application Priority Data

Jun. 26, 1996 [JP] Japan .................................. 8-166199

[51] Int. Cl.⁶ .............................. H05K 7/14; H01R 13/62
[52] U.S. Cl. ......................... 361/798; 361/684; 361/726; 361/801; 439/61; 439/159
[58] Field of Search ..................................... 361/685, 726, 361/727, 728, 729, 740, 748, 754, 759, 784, 788, 796, 798, 684, 801; 439/61, 159

[56] References Cited

U.S. PATENT DOCUMENTS

| | | | |
|---|---|---|---|
| 5,299,089 | 3/1994 | Lwee | 361/798 X |
| 5,324,204 | 6/1994 | Lwee | 439/64 |
| 5,466,166 | 11/1995 | Law et al. | 439/159 |
| 5,483,419 | 1/1996 | Kaczeus, Sr. et al. | 361/685 |
| 5,591,047 | 1/1997 | Yamada et al. | 439/541.5 |
| 5,622,510 | 4/1997 | Ishida | 439/160 |
| 5,643,001 | 7/1997 | Kaufman et al. | 439/158 |
| 5,655,918 | 8/1997 | Soh | 439/159 |

FOREIGN PATENT DOCUMENTS 07288155  10/1995  Japan .

*Primary Examiner*—Leo P Picard
*Assistant Examiner*—Jayprakash N. Gandhi
*Attorney, Agent, or Firm*—Brinks Hofer Gilson & Lione

[57] ABSTRACT

A PC Card slot which can enhance the safety, operability and assembly efficiency of a device by removing and locking a plurality of PC Cards by the use of only a single operating knob. In the case of the aforementioned PC Card slot, a lock portion, which is able to abut against a PC Card, is formed in an operating knob, which is provided on a lever operating stick, and is further used as a lock mechanism for preventing a PC Card from coming off the PC Card slot.

5 Claims, 24 Drawing Sheets

## PC CARD CONNECTOR DEVICE

BACKGROUND OF THE INVENTION

1. Field of the Invention

The present invention generally relates to a PC (Personal Computer) Card slot and, more particularly, to a PC Card slot provided with a lock mechanism (or structure) for preventing a PC card from unintentionally coming or falling off the slot owing to a shock (or vibration), a malfunction and so forth.

2. Description of the Prior Art

In recent years, there has been striking reduction in size, weight, thickness and power consumption of electronic equipment. Especially, the size and weight of the personal computer have decreased markedly with the development thereof from the desktop computer through the laptop computer to the notebook computer. Further, in addition to these, new small information (processing) devices, such as a handwriting information (processing) device which is excellent in portability, have emerged.

In such a field, PC cards, such as an IC memory card obtained by packaging a semiconductor memory on a credit-card-sized card highly densely, and an I/O card, attract attention as media for information interchange. As compared with magnetic recording media such as a floppy disk and a hard disk, such PC Cards have the following outstanding merits.

(1) PC Card eliminates the need for a driver unit, so that the reduction in size and weight of the device can be achieved.

(2) PC Card can operate at a low voltage of 3 volts or so, with the result that a long battery-driven operation can be achieved and that there can be provided a device which excels in portability.

(3) High-speed access to the device can be realized.

(4) PC Cards excel in what is called "environment-proof". Ranges of allowable temperature and moisture thereof are wide. Moreover, PC Cards are vibration-proof and shock-resistant.

(5) Media can be easily carried. This allows data exchange to be achieved. Thus, PC Cards are superior in potability.

(6) PC Cards can be loaded with various semiconductor memories such as ROM and RAM.

Such PC Cards are classified into three types by thickness thereof. Usually, PC Cards having a thickness of 3.3 mm are classified as Type I. Further, PC Cards having a thickness of 5.0 mm is classified as Type II. Moreover, PC Cards having a thickness of 10.5 mm is classified as Type III.

Furthermore, PC Cards acting as memory cards are used as add-on (or add-in) memories, or used like HDs (namely, Hard Disks) or FDDs (namely, Floppy Disk Drivers (or Drive units)). On the other hand, usually, PC Cards acting as I/O cards are not used singly. Such a PC Card is used by being connected with an accessory or by being connected to another device through a cable or the like. PC Cards of major kinds are a LAN card, a FAX/MODEM card and a PCM sound card.

Currently, notebook personal computers and handwriting information (processing) devices, which are provided with what are called PC Card slots so as to be equipped with such PC Cards, respectively, are provided on the market by many makers.

Hereinafter, a conventional PC Card slot 41 will be described by referring to FIGS. 20 to 27. The conventional PC Card slot is formed in such a manner as to be able to be equipped with two PC Cards 2. FIG. 20 is a plan view of the conventional PC Card slot 41. FIG. 21 is a front view of the conventional PC Card slot of FIG. 20. FIG. 22 is a left side view of the conventional PC Card slot of FIG. 20. FIG. 23 is a right side view of the conventional PC Card slot of FIG. 20. FIG. 24 is a sectional view taken on line XXIV—XXIV of FIG. 20.

Further, FIG. 25 is a plan view of the conventional PC Card slot 41 into which a single PC Card 2 is fit. FIG. 26 is a front view of such a conventional PC Card slot 41. Moreover, FIG. 27 is a plan view of the conventional PC Card slot 41 from which the PC Card 2 is released.

In the case of the conventional PC Card slot 41 illustrated in these figures, a slot main body 42 is divided into two stages (namely, upper and lower stages), namely, an upper slot main body 42 and a lower slot main body 42 in such a manner that two PC Cards 2 of Type I or Type II can be fit thereinto. Each of these slot main bodies 42 is constituted by thin plates made of metallic materials such as steel. Further, cavities, into which PC Cards 2 are inserted, are formed by bending these thin plates. Thus, the aforementioned slot main bodies 2 serve as guides each for guiding the aforesaid PC Card 2 thereinto when inserting the aforesaid PC Card 2 into the aforementioned cavity.

Moreover, an upper connector 43a and a lower connector 43b are provided in these upper and lower slot main bodies 42, respectively. These connectors 43a and 43b have roles in positioning the PC Cards 2 and in electrically connecting each of the PC Cards 2 with a wiring board 44. Namely, each of these connectors 43a and 43b is provided at the rear of the corresponding slot main body 42 in such a way as to extend from the left end to the right end thereof. Furthermore, two rows (namely, upper and lower rows) of pin terminals are embedded in a front-side portion of the PC Card slot 41 as illustrated in FIG. 21. Additionally, as shown in FIGS. 22 through 24, the wiring board 44 is supported and sandwiched between the upper connector 43a and the lower connector 43b in such a manner as to protrude from therebetween toward the back of the wiring board 44. Further, the aforementioned pin terminals 45 are fit into two rows (namely, upper and lower rows) of fitting holes (not shown) formed in the PC Card 2 to thereby hold the PC Card 2. In this way, basically, the PC Card 2 is fixed to the slot by a fitting force acting between the PC Card 2 and a set of the pin terminals 45. Moreover, as illustrated in FIG. 24, the aforementioned pin terminals 45 are electrically connected to and a cable terminal (not shown), which is electrically connected to the main unit (not shown) of the device, is coupled to the aforesaid wiring board 44. Therefore, each of the aforementioned PC Cards 2 is connected to the main unit of the device through the pin terminals 45, the wiring board 44 and the cable terminal in sequence.

A releasing lever for canceling (namely, releasing the PC Card from) the fitting force acting between the PC Card 2 and the set of the pin terminals 45 of the connector 43 is rotatably journalled in a corresponding one of the main bodies 42 between each of the connectors 43 and the corresponding one of the slot main bodies 42. Let reference characters 46a and 46b denote an upper releasing lever, which corresponds to the upper slot main body 42, and a lower releasing lever, which corresponds to the lower slot main body 42, respectively. Each of these releasing levers is formed so that the length thereof is nearly equal to the distance between the left and right edges of each of the aforementioned slot main bodies 42. One end portion (incidentally, this end portion is the left end portion in the case of the upper releasing lever 46a of FIG. 20, and is the right end portion in the case of the lower releasing lever 46b) of each of the releasing levers 46a and 46b is formed as a projection portion 47 protruding from the slot main bodies 42. The other end portion (incidentally, this end portion is the right end portion in the case of the upper releasing lever 46a of FIG. 20, and is the left end portion in the case of the lower releasing lever 46b) of each of the releasing levers 46a and 46b is formed as an abutting portion 48 adapted to abut against an edge portion of the PC Card 2 when held in a corresponding one of the slot main bodies 42.

A lever operating stick 49 is attached to the aforementioned projection portion 47. Further, an operating knob 50 is attached to an operated-side end portion (namely, a lower end portion as viewed in FIG. 20) of this lever operating stick 49. This lever operating stick 49 is held by holding clicks 51 and is adapted to be able to make reciprocating motion back and forward.

Therefore, in the case that the aforementioned PC Card 2 is fit into the PC Card slot 41, the abutting portion 48 of the aforementioned releasing lever is pushed by the edge portion of the aforementioned PC Card 2 and is turned counterclockwise, as illustrated in FIG. 25. Thus, the aforementioned lever operating stick 49 is slid downwardly as viewed in this figure. Further, the aforementioned PC Card 2 is fit into a corresponding one of the aforesaid slot main bodies 42 by coupling the aforementioned PC Card 2 with the pin terminals 45 of the aforesaid connector 43.

In contrast, when removing the aforementioned PC Card 2 from the PC Card slot 41, the operating knob 50 of the aforementioned lever operating stick 49 is pushed and is thus turned clockwise, as illustrated in FIG. 26. Thus, the edge portion of the aforementioned PC Card 2 is pushed by the projection portion of the aforementioned releasing lever by utilizing what is called the principle of a lever (namely, utilizing leverage). Consequently, the fitting force acting between the aforementioned PC Card 2 and the aforesaid pin terminals 45 is released, and the PC Card 2 is removed from the corresponding one of the aforementioned slot main bodies 42.

Meanwhile, PC Card slot 41 as above described is frequently used in portable devices which highly frequently undergo shocks and vibrations in comparison with ordinary desktop (or tabletop) devices. Thus, such portable devices need to be provided with a coming-off preventing lock mechanism for preventing a PC card from easily coming off a PC Card slot.

However, there is no conventional PC Card slot 41 formed in such a manner as to be integral with a coming-off preventing lock mechanism. Further, the lock mechanism is provided in the device separately from the PC Card slot 41.

Thus, the operating knob 50 is placed separately from the lock mechanism, so that the operability of the conventional PC Card slot is low. Further, the conventional PC Card slot has encountered a problem in respect of efficiency in assembling the device.

Moreover, an operation of the operating knob 50 is performed separately from (or independently of) that of the lock mechanism, so that users have easily forgotten to lock and unlock (namely, release the lock). Therefore, when forgetting to lock the lock mechanism, there are fears that the PC Card 2 is easy to come off the slot 41 owing to vibrations and shocks and thus, needless to say, an operation failure of the PC Card 2 is caused, and that this causes what is called a system error of the main unit of the device, or that at the worst, electronic parts provided in the PC Card 2 are damaged. In contrast, when operating the knob 50 without releasing the lock of the lock mechanism, an excessive force is applied to the releasing lever. Thus, there is a fear that the PC Card slot 41 itself is destroyed.

Furthermore, the conventional PC Card slot 41 has problems in that if the PC Card slot 41 is placed in the inner part of the device so that the end portions of the PC Card 2 do not project from the device during the PC Card 2 is fit thereinto, the operating knob 50 is also placed in the inner part of the device and thus becomes difficult to operate, and in that if large space is taken up in the vicinity of the operating knob 50 so as to improve the operability of the knob 50, the size of the device becomes large inconveniently.

SUMMARY OF THE INVENTION

An object of the present invention is to provide a PC Card slot which can enhance the safety, operability and assembly efficiency by using only a single operating knob to remove and lock a plurality of PC Cards.

Another object of the present invention is to increase the assembly efficiency at the time of incorporating a coming-off preventing lock mechanism into the main body of a device and to enhance the operability of the device by forming a lock portion, which can abut against a PC Card, in an operating knob formed on a lever operating stick.

A further object of the present invention is to minimize a fitting space in a slot or to enhance the operability of the slot by performing an operation of releasing the fitting of a plurality of PC Cards into connectors by the use of a single lever operating stick and by operating a lock mechanism, which is used for preventing each PC Card from coming off a PC Card slot, by the use of a single operating knob.

Still another object of the present invention is to easily release the fitting of a plurality of PC Cards into connectors by performing a simple operation on a lever operating stick by first forming an engaging portion in the lever operating stick and then selectively engaging the engaging portion with one of releasing levers as a result of turning the lever operating stick and finally operating the selected releasing lever.

Yet another object of the present invention is to simultaneously perform both of an operation of releasing the aforementioned lock of a lock mechanism and an operation of selecting the aforementioned releasing lever by turning a lever operation stick and to simultaneously perform both of an operation of releasing the lock of the lock mechanism and an operation of removing a PC Card by carrying out a simple operation on the lever operating stick.

Still another object of the present invention is to eliminate a special space used for operating a lever operating stick and enhance the operability of a PC Card slot by providing in each slot main body a stopper for holding a lever operating stick in a lock position and further providing a spring member for pushing a lever operating stick, which is not restricted by the stopper, to the front of the main body, and by engaging the aforementioned stopper with the lever operating stick as a result of pushing and retreating the aforementioned operating knob when locking a PC Card in a position where a lock portion of the operating knob can lock the aforementioned PC Card in the direction of the circumference of the lever operating stick, and by protruding the aforementioned operating knob to an operating face by the elastic (or resilient) force of the aforementioned spring member when releasing the lock of the PC Card.

BRIEF DESCRIPTION OF THE DRAWINGS

Other features, objects and advantages of the present invention will become apparent from the following description of a preferred embodiment with reference to the drawings in which like reference characters designate like or corresponding parts throughout several views, and in which.

DETAILED DESCRIPTION OF THE PREFERRED EMBODIMENT

Hereinafter, the preferred embodiment of the present invention will be described in detail by referring to FIGS. 1 to 19.

Figure 1:
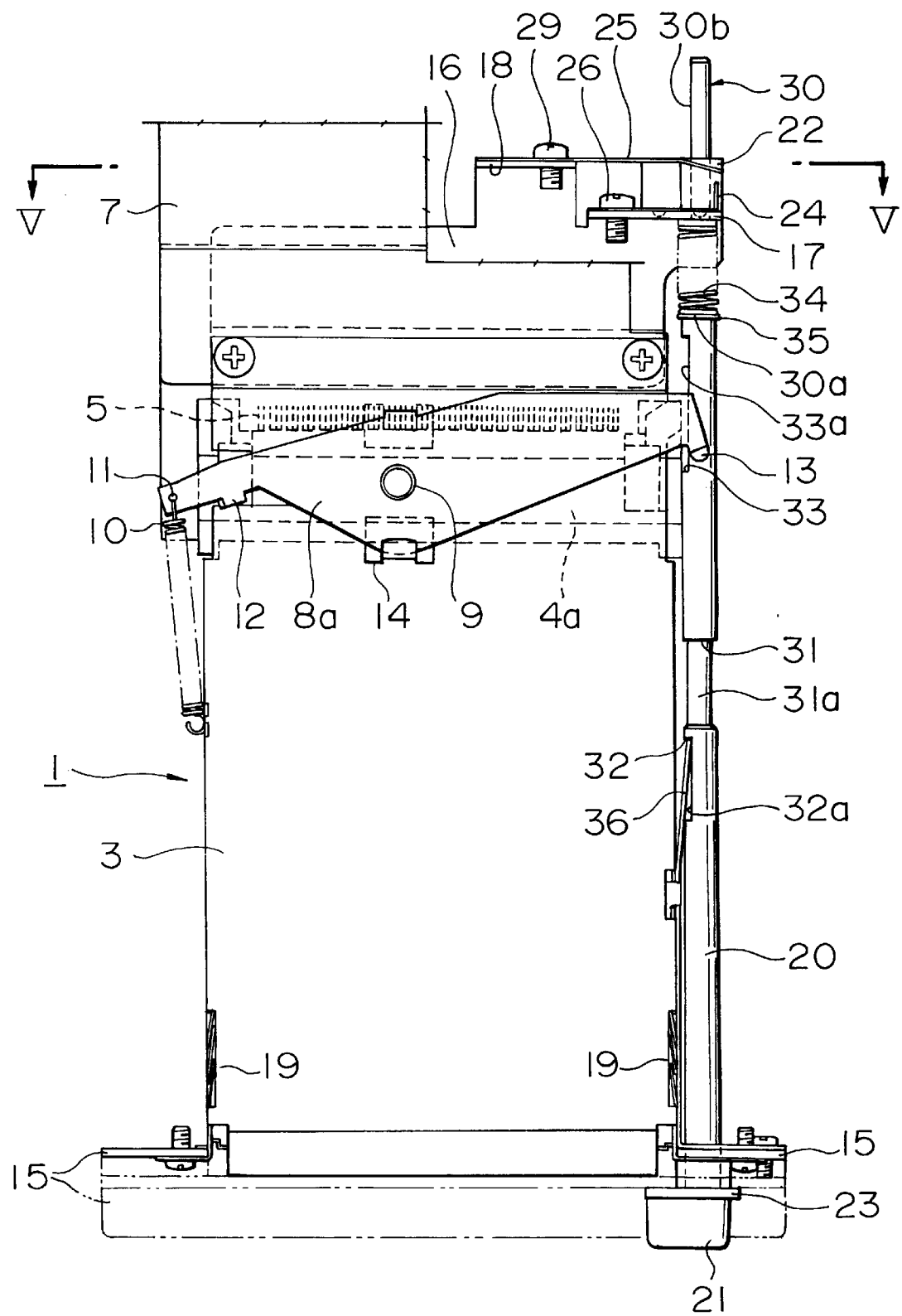
FIG. 1 is a plan view of a PC Card slot embodying the present invention, which is an embodiment of the present invention.
Figure 2:
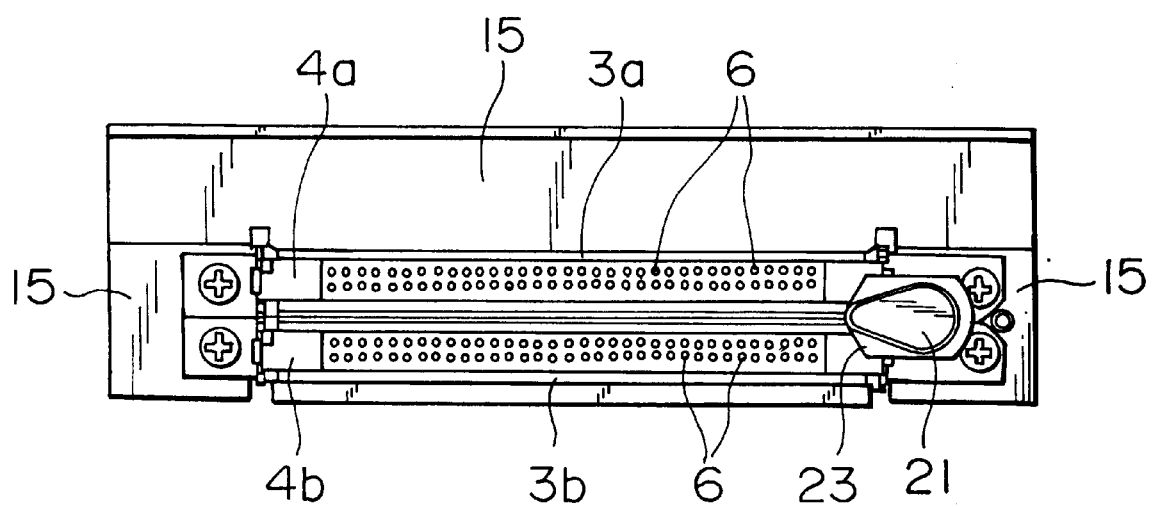
FIG. 2 is a front view of the PC Card slot of FIG. 1.
Figure 3:
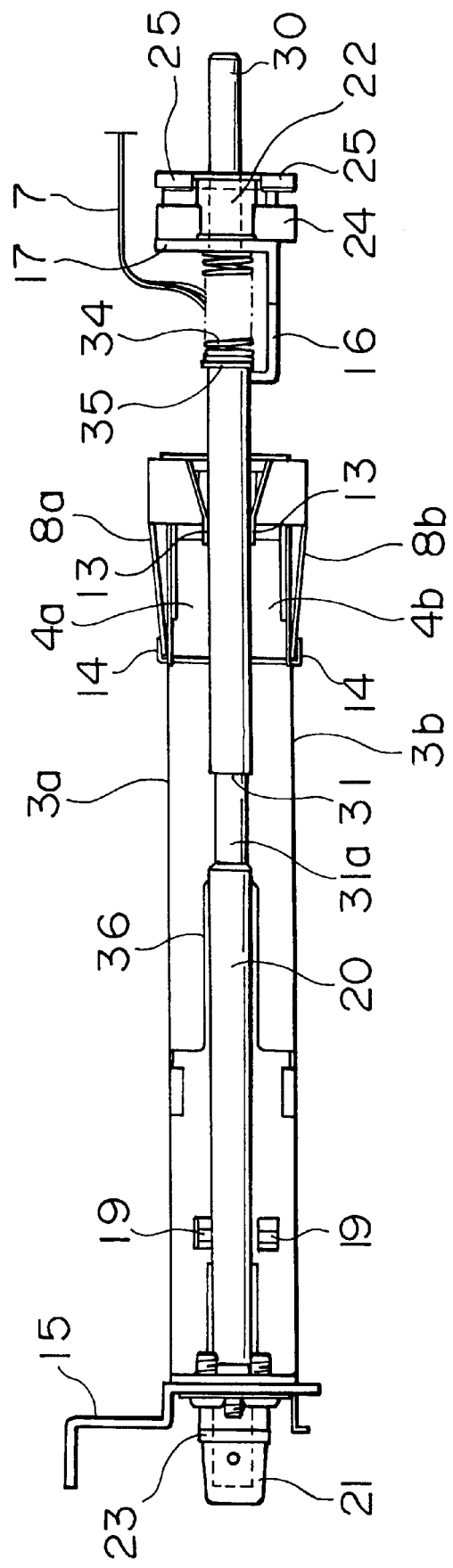
FIG. 3 is a right side view of the PC Card slot of FIG. 1.
Figure 4:
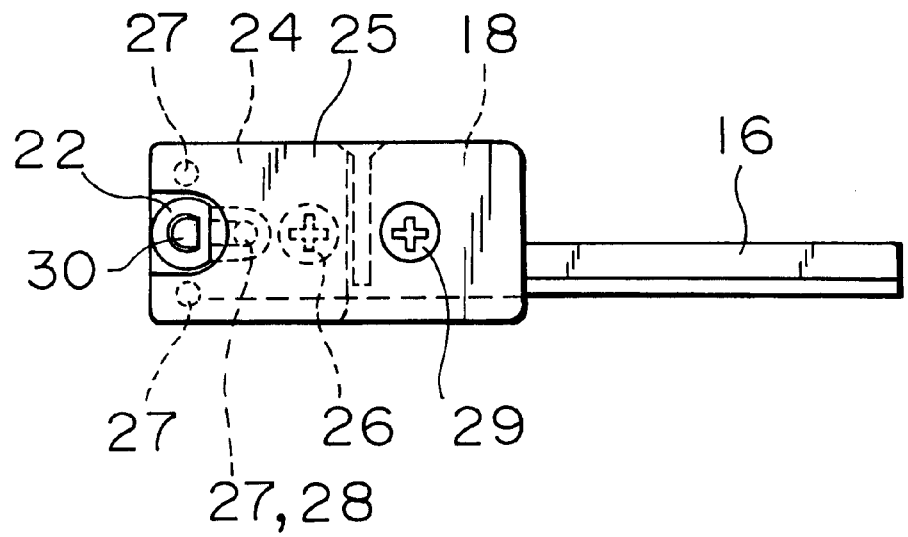
FIG. 4 is a rear view of the PC Card slot of FIG. 1.
Figure 5:
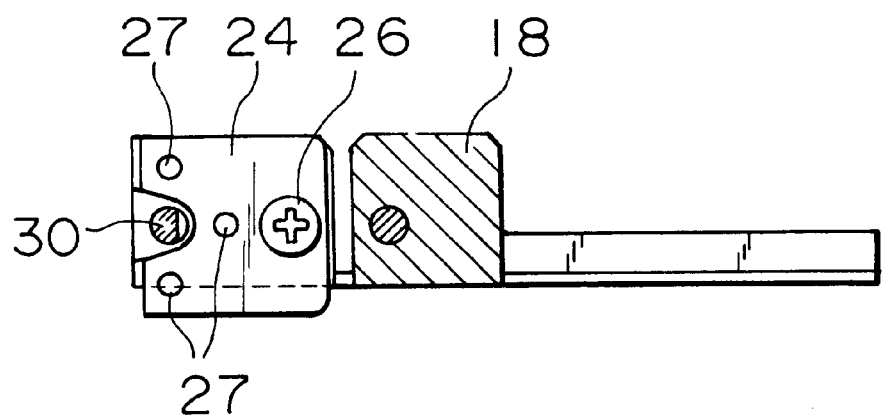
FIG. 5 is a sectional view taken on line V—V of FIG. 1.

FIG. 1 is a plan view of a PC Card slot embodying the present invention, which is this embodiment of the present invention. FIG. 2 is a front view of the PC Card slot of FIG. 1. FIG. 3 is a right side view of the PC Card slot of FIG. 1. FIG. 4 is a rear view of the PC Card slot of FIG. 1. FIG. 5 is a sectional view taken on line V—V of FIG. 1.

In the case of the PC Card slot 1 of this embodiment of the present invention illustrated in these figures, a slot main body 3 is divided into two stages (namely, upper and lower stages), namely, an upper slot main body 3a and a lower slot main body 3b in such a manner that two PC Cards 2 of Type I or Type II can be fit thereinto and that a single PC Card 2 of Type III can be fit thereinto. Each of these slot main bodies 3 (3a and 3b) is constituted by thin plates made of metallic materials such as steel. Further, cavities, into which PC Cards 2 are inserted, are formed in the slot main bodies, respectively, by bending these thin plates. Thus, the aforementioned slot main bodies 3 (3a and 3b) serve as guides each for guiding the aforementioned PC Card 2 thereinto when inserting the aforesaid PC Card 2 into the aforementioned cavity.

Moreover, an upper connector 4a and a lower connector 4b are provided in these upper and lower slot main bodies 3a and 3b, respectively. These connectors 4a and 4b have roles in electrically connecting each of the PC Cards 2 with a wiring board 5 and further has the effect of holding the PC Cards 2 in the slot main bodies 3a and 3b by the fitting forces acting between these connectors and the PC Cards 2. Namely, each of these connectors 4a and 4b is provided at the rear of the corresponding slot main body 3a or 3b in such a way as to extend from the left end to the right end thereof. Furthermore, two rows (namely, upper and lower rows) of pin terminals 6 are embedded in a front-side portion of the PC Card slot 1 as illustrated in FIG. 2. Additionally, the wiring board 5 is supported and sandwiched between the upper connector 4a and the lower connector 4b in such a manner as to protrude from therebetween toward the back of the wiring board 5. Further, the aforementioned pin terminals 6 are fit into two rows (namely, upper and lower rows) of fitting holes (not shown) formed in the PC Card 2 to hold the PC Card 2 by the fitting force. Moreover, the aforementioned pin terminals 6 are electrically connected to and a cable terminal 7 (not shown), which is electrically connected to the main units (not shown) of various devices, is coupled to the aforesaid wiring board 5. Therefore, each of the aforementioned PC Cards 2 is connected to the main unit of the device through the pin terminals 6, the wiring board 5 and the cable terminal 7 in sequence.

Releasing levers 8 (namely, 8a and 8b) each for releasing the PC Card 2 from the fitting force acting between the PC Card 2 and the set of the pin terminals 6 of the connector 4 are rotatably journalled by a rotation (or pivot) shaft 9 in the proximity of the connecting position between the connector 4a or 4b and the aforementioned PC card 2 and are placed on the top surface of the aforementioned upper slot main body 3a and under the bottom surface of the aforementioned surface of the lower slot main body 3b, respectively. Let reference characters 8a and 8b denote an upper releasing lever, which corresponds to the upper slot main body 3a, and a lower releasing lever, which corresponds to the lower slot main body 3b, respectively. These releasing levers 8a and 8b are made of metallic plates and formed so that both ends of each of these levers 8a and 8b protrude outwardly from the left and right ends of the slot main bodies 3, respectively. Between both ends of each of the aforementioned releasing levers 8a and 8b, a spring engaging hole 11, which a spring 10 for the lever is engaged with and is fixed to, is formed in and an abutting portion 12 for abutting against the edge portion of a PC Card 2 when held in the slot main body 3 is formed by bending a part of each of the aforementioned releasing levers 8 in one end portion (namely, the left end portion of each of the upper releasing lever 8a and the lower releasing lever 8b in FIG. 1). This abutting portion 12 is pushed by the edge portion of the PC Card 2 when fit into the slot. Thus, the aforementioned releasing lever 8 is turned clockwise as viewed in FIG. 1. When removing the aforementioned PC Card 2 from the slot main body 3, the edge portion of the aforementioned PC Card 2 is pushed, so that the fitting force acting between this PC Card 2 and the set of the aforesaid pin terminals 6 is canceled.

On the other hand, a pushing portion 13 to be pushed backwardly (namely, upwardly as viewed in FIG. 1) by a lever operating step portion 33 of a lever operating stick 20 (to be described later) is formed in the other end portion (namely, the right end portion of each of the upper releasing lever 8a and the lower releasing lever 8b in FIG. 1) of each of the aforementioned releasing levers 8a and 8b by bending this other end portion of the releasing lever in the direction of thickness of the aforementioned slot main body 3 and further folding back this portion horizontally. Moreover, the aforesaid releasing lever 8 is pushed by a pushing plate 14 in the vicinity of the aforementioned rotation shaft 9.

Furthermore, the coil spring 10 has one end engaged with and fixed to the spring engaging hole 11 and further has the other end engaged with and fixed to the top edge of the left side surface (as viewed in FIG. 1) of the aforementioned slot main body 3 and is operative to push the aforesaid releasing lever 8 counterclockwise (as viewed in FIG. 1). Thus, when canceling the fitting force by pushing the edge portion of the aforementioned PC Card 2 by means of the aforesaid abutting portion 12 of the aforementioned releasing lever 8, the aforementioned PC Card 2 is sprung out to a user by the pushing (or pressing) force of the coil spring 10 for the lever. Consequently, the user can easily take out the PC Card 2 from the slot.

A front attachment plate 15 and a rear attachment plate 16, which are used for fixing the slot to the main unit of a device, are placed in the front portion (namely, the lower portion illustrated in FIG. 1) and the rear portion (namely, the upper portion illustrated in FIG. 1) of the aforementioned slot main body 3, respectively, as shown in FIG. 3. The aforementioned front attachment plate 15 juts out from the aforementioned slot main body 3 upwardly and laterally by a proper extent. On the other hand, the aforementioned rear attachment plate 16 is stuck out backwardly by a proper extent. Further, as shown in FIG. 1, a first bending portion 17 and a second bending portion 18 are formed at two end parts of the plate 16 by being upwardly bent.

Plate (or leaf) springs 19 for pushing the side surfaces of the aforementioned PC Card 2 inwardly are formed in the vicinities of the rear ends of the inner side surfaces of the aforesaid slot main body 3, respectively. The plate springs 19 have the function of earthing (or grounding) the aforesaid PC Card 2 by coming into contact with the side surfaces of the aforesaid PC Card 2 and further have the function of preventing an occurrence of looseness in the slot when fitting the aforementioned PC Card 2 thereinto.

Further, the single lever operating stick 20 is disposed at the middle position between the aforementioned upper slot main body 3a and the aforementioned lower slot main body 3b on the right side surface (as viewed in FIG. 1) of the aforesaid slot main body 3. This lever operating stick 20 is rotatably (or pivotally movably) held by the rightwardly protruding portion of the aforementioned front attachment plate 15 and the first bending portion 17 of the aforementioned rear attachment plate 16. To the front end (namely, the bottom as viewed in FIG. 1) of this lever operating stick 20, an operating knob 21 to be grasped by a user when operating this stick is fixed. Moreover, a rotation restricting member 22 for restricting a turning operation of this lever operating stick 20 is fit onto the outer circumferential surface of the rear portion of this lever operating stick 20 in such a way as to be able to slide in the axial direction.

As shown in FIG. 2, a lock portion 23, which is adapted to abut against the corner portion of a PC Card 2 to thereby prevent this PC Card 2 from coming off the connector 4 owing to vibrations or the like, is formed on the operating knob 21. This lock portion 23 is shaped nearly like a rectangle. Thus, when the aforementioned operating knob 21 is turned from the lock position illustrated in FIG. 2 to a position (namely, a first lock releasing position) where this knob is turned clockwise by 90 degrees, or when the aforementioned operating knob 21 is turned from the lock position illustrated in FIG. 2 to another position (namely, a second lock releasing position) where this knob is turned counterclockwise by 90 degrees, it follows that this lock portion 23 does not abut against the aforementioned PC Card 2. Consequently, the lock is released.

On the other hand, the aforementioned rotation restricting member 22 attached to the rear end of the lever operating stick 20 is sandwiched between a rotation stopper plate 24 and a restricting plate spring 25 as illustrated in FIG. 1. The aforementioned rotation stopper plate 24 is fixed to the first bending portion 17 of the aforesaid rear attachment plate 16 by a first screw 26 and thus abuts against the front portion of the aforementioned rotation restricting member 22 and has a right end portion bent backwardly. Thus, when the aforementioned lever operating stick 20 is turned, the rotation restricting member 22 abuts against the bending portion of this rotation stopper plate 24, so that the range of a turning operation of the stick is restricted in such a manner that the stick does not go beyond the aforementioned first and second lock releasing positions. Further, three depression portions 27 are formed in the rear portion of this rotation stopper plate 24, in such a manner as to corresponding to the first lock releasing position, the lock position and the second lock releasing position of the aforementioned lever operating stick 20, respectively, as illustrated in a sectional diagram of FIG. 5, namely, a sectional view taken on line V—V of FIG. 1. Moreover, a single convex portion 28 to be fit into these depression portions 27 is formed in the front portion of the aforementioned rotation restricting member 22. Thus, when turning the aforementioned lever operating stick 20, the aforementioned convex portion 28 is fit into one of the aforesaid depression portions 27 to thereby position the aforementioned lever operating stick 20.

Further, the aforementioned restricting plate spring 25 is fixed to the second bending portion 18 of the aforementioned rear attachment plate 16 by a second screw 29 and is thus made to abut against the rear end surface of the aforementioned rotation restricting member 22 and is adapted to push the aforementioned rotation restricting member 22 forward from behind. The convex portion 28 of the aforementioned rotation restricting member 22 is securely fit into the depression portion 27 of the aforesaid rotation stopper plate 24 by the pushing force of this restricting plate spring 25, so that the aforementioned lever operating stick 20 is difficult to shift from the first lock releasing position, the lock position and the second lock releasing position.

Moreover, a rotation restricting flat portion 30, a stick coming-off preventing step portion (namely, an engaging portion) 31, a lock holding step portion (namely, an engaging portion) 32 and a lever operating step portion (namely, an engaging portion) 33 are formed in the aforementioned lever operating stick 20.

The aforesaid rotation restricting flat portion 30 is located in the rear end portion of the aforementioned lever operating stick 20 and has a diameter, which is set as being less than the outer diameters of other portions, and a step portion 30a for engaging with and stopping a coil spring 34 (to be described later) is formed in this rotation restricting flat portion 30. Moreover, as illustrated in FIGS. 4 and 5, a flat face 30b planed in the axial direction is provided in this rotation restricting portion 30. The aforementioned rotation restricting member 22 is fit into this rotation restricting flat portion 30 in such a way as to be able to slide in the axial direction. Moreover, a stick coil spring 34 for pushing the lever operating stick 20 to the front of the slot at all times is wound around this rotation restricting flat portion 30. The reason for forming an axial part of this rotation restricting flat portion 30 as a flat face is to prevent the aforementioned rotation restricting member 22 from rotating relative to the lever operating stick 20 when turning the aforementioned lever operating stick 20 so as to change the position of the stick 20 to the lock position, the first lock releasing position or the second lock releasing position. Further, the coil spring 34 for the stick is adapted so that the rear end portion thereof is made to abut against the aforementioned first bending portion 17 and that the front end portion thereof is made to abut against the aforesaid step portion 30a of the aforementioned rotation restricting flat portion 30 to thereby push the lever operating stick 20 to the front of the slot.

The aforementioned stick coming-off preventing step portion 31 is used for preventing the aforesaid lever operating stick 20 from coming off the aforementioned rear attachment plate 16 to the front of the slot owing to the pushing force of the aforementioned coil spring 34 for the stick. This stick coming-off preventing step portion 31 is placed nearly at the central portion in the axial direction of the lever operating stick 20 and is formed on a smaller-diameter portion 31a that is formed in such a manner as to have a diameter which is smaller than the outside diameter of the lever operating stick 20. On the other hand, a stopper spring 36 constituted by a plate spring for abutting against the aforementioned stick coming-off preventing step portion 31 is disposed on the side surface of the aforementioned slot main body 3. This stopper spring 36 is adapted to engage with the aforementioned stick coming-off preventing step portion 31 at a place where the rear end portion of the aforementioned lever operating stick 20 pushed to the front of the slot by the coil spring 34 for the stick does not come off the aforesaid rotation restricting member 22.

The aforementioned lock holding step portion 32 is placed in front of the aforesaid stick coming-off preventing step portion 31 formed on the lever operating stick 20 and is formed on a flat face 32a planed in such a way as to face the side surface of the aforementioned slot main body 3 when the aforesaid lever operating stick 20 is turned to the lock position. This lock holding step portion 32 is adapted to be engaged with the aforementioned stopper spring 36 when the aforementioned lever operating stick 20 is pushed to the lock position. Thereby, this lock holding step portion 32 is adapted to securely hold the aforesaid lever operating stick in the lock position.

The aforesaid lever operating step portion 33 is used for selectively engaging with the pushing portion 13 of one of the aforementioned releasing levers 8 and operating this releasing lever 8 when the aforementioned lever operating stick 20 is turned to the first lock releasing position or the second lock releasing position. Further, the lever operating step portion 33 is formed on a flat face 33a of this lever operating stick 20, which is planed in such a manner as to face upwardly, in such a way that the pushing portion 13 of the aforementioned releasing lever 8 can engage with this step portion when the aforementioned lever operating stick 20 is turned to the first lock releasing position. Therefore, when the aforementioned lever operating stick 20 is in the second lock releasing position, the aforesaid lever operating step portion 33 is placed below the slot main body 3. This lever operating step portion 33 is adapted to push the pushing portion 13 of the aforementioned upper releasing lever 8a and turn the aforementioned releasing lever 8a when backwardly pushing the aforesaid lever operating stick 20 which has been in the first lock releasing position. If the upper releasing lever 8a is turned in this way, the aforementioned abutting portion 12 of this upper releasing lever 8a pushes the edge portion of the aforementioned PC Card 2 and thus cancels the fitting force acting between the PC Card 2 and the set of the pin terminals of the aforementioned upper connector 4a. Similarly, the lever operating step portion 33 have the same functions even when the aforementioned lever operating stick 20 is in the second lock releasing position. Namely, the lever operating step portion 33 pushes the pushing portion 13 of the lower releasing lever 8b to thereby turn the lower releasing lever 8b. Consequently, the fitting force acting between the PC Card 2 and the set of the pin terminals of the aforementioned lower connector 4b is canceled.

Next, an operation of the aforementioned PC Card slot 1 of the present invention, which is the embodiment of the present invention, will be described with reference to FIGS. 6 to 19.

Figure 6:
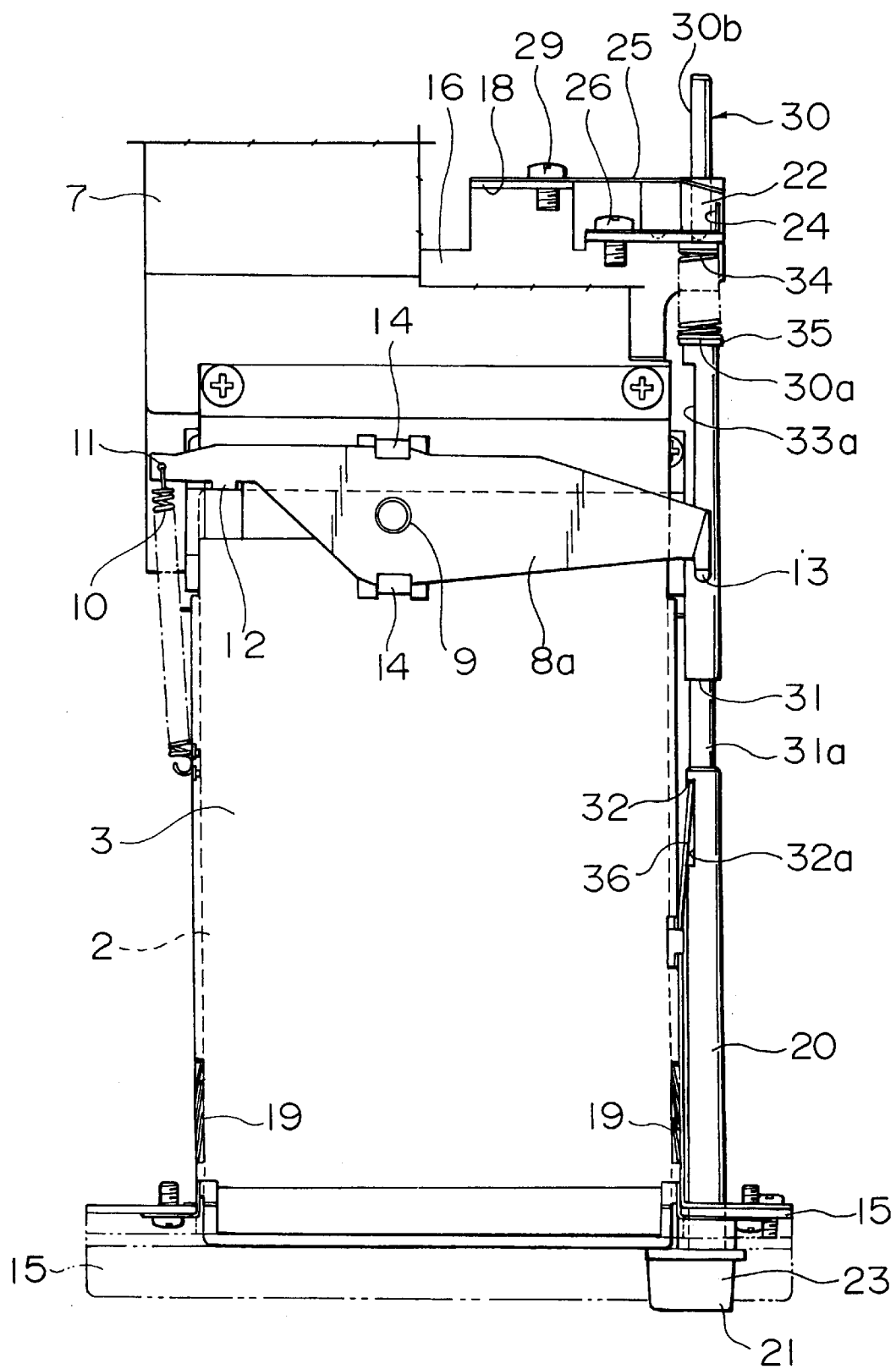
FIG. 6 is a plan view of this PC Card slot of the present invention, illustrating a condition of this embodiment of the present invention, in which a PC Card is fit into a slot main body and in which a lever operating stick is in a lock position.
Figure 7:
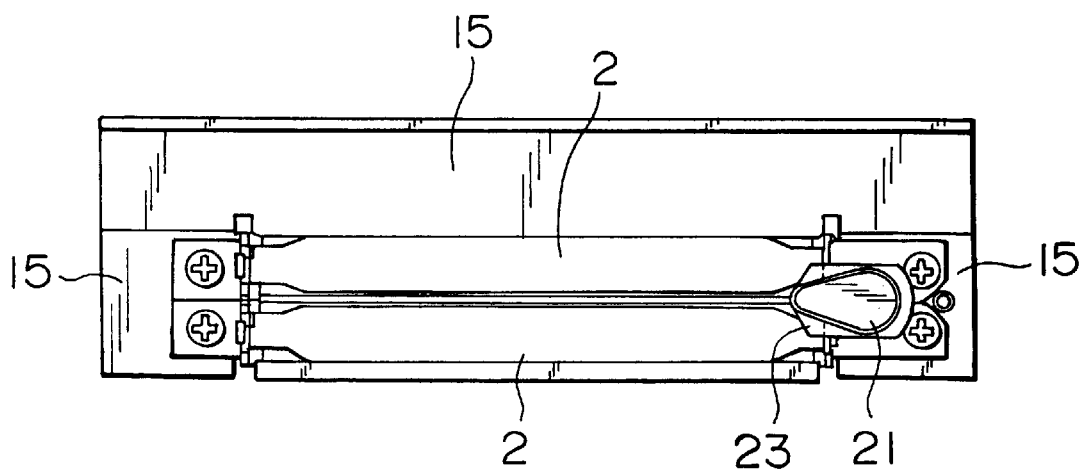
FIG. 7 is a front view of the PC Card slot in the condition as illustrated in FIG. 6.
Figure 8:
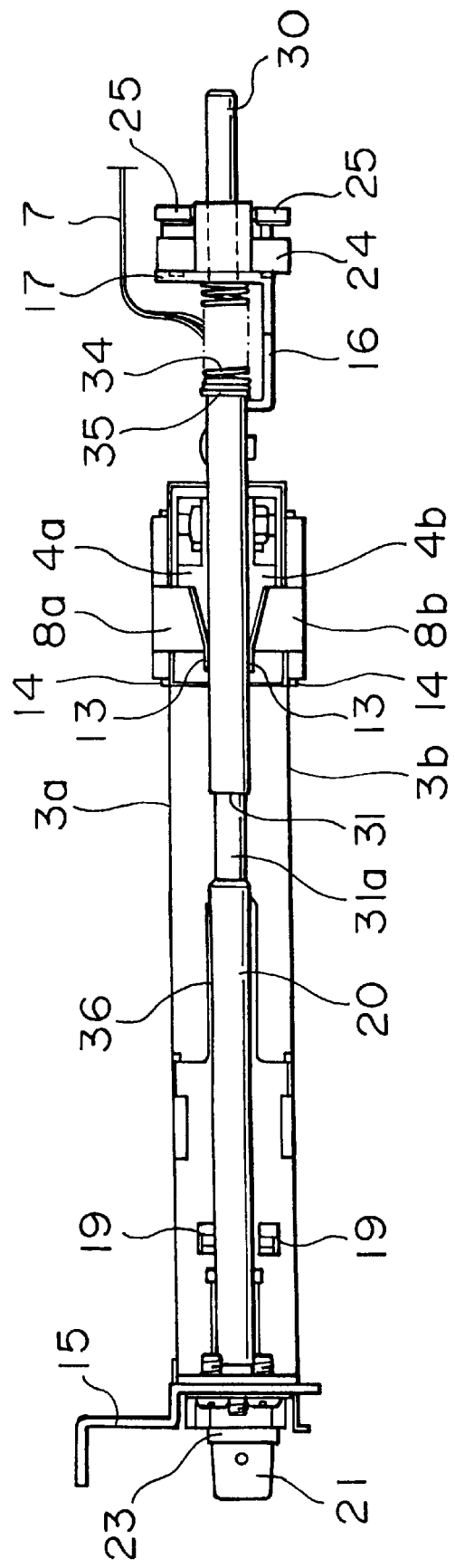
FIG. 8 is a right side view of the PC Card slot in the condition as illustrated in FIG. 6.
Figure 9:
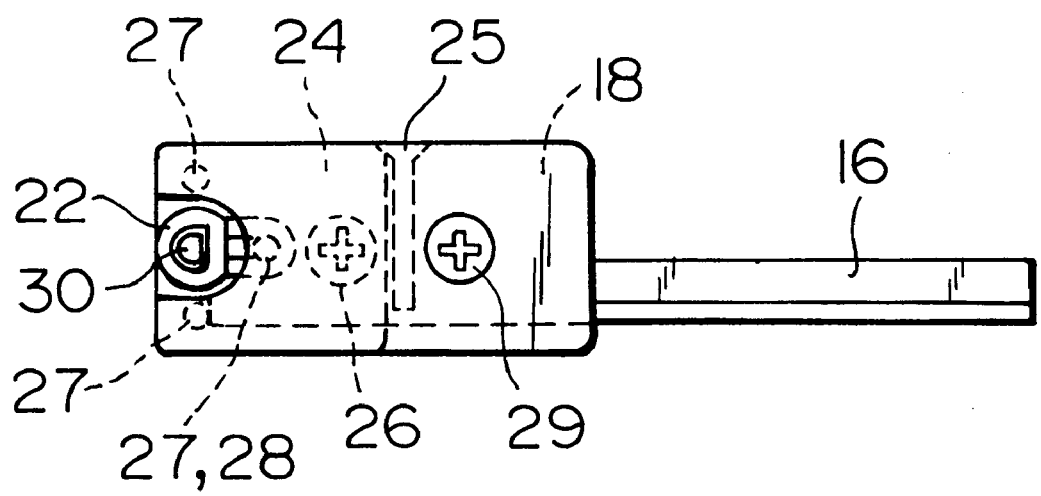
FIG. 9 is a rear view of the PC Card slot in the condition as illustrated in FIG. 6.

First, the case, in which the lock for preventing the coming-off of a PC Card 2 from the PC Card slot 1 is performed by fitting the PC Card 2 into the PC Card slot 1, will be described by referring to FIGS. 6 through 9. FIGS. 6 to 9 illustrate the case that the PC Card 2 is fit into the PC Card slot 1 and the lever operating stick 20 is in the lock (state) position. FIG. 6 is a plan view of such a PC Card slot. FIG. 7 is a front view of the PC Card slot in the condition as illustrated in FIG. 6. FIG. 8 is a right side view of the PC Card slot in the condition as illustrated in FIG. 6. FIG. 9 is a rear view of the PC Card slot in the condition as illustrated in FIG. 6.

To fit the PC Card 2 into the PC Card slot 1, this PC Card 2 is inserted thereinto along the inner surface of the aforementioned slot main body 3. At that time, the aforementioned lever operating stick 20 is in the first lock releasing position or in the second lock releasing position. When the aforementioned PC Card 2 is inserted to the vicinity of the aforementioned connector 4 provided in the slot main body 3, the abutting portion 12 of the aforementioned releasing lever 8 abuts against a corner portion (namely, the upper left corner as viewed in FIG. 6) of this PC Card 2. Thence, the aforementioned PC Card 2 is further inserted by pushing this abutting portion 12. At that time, because the coil spring 10 for the lever is attached to the end portion at the side where the abutting portion 12 of the aforementioned releasing lever 8 is formed, the aforesaid abutting portion 12 is pushed against the pressing force of this coil spring 10 for the lever. Thus, the aforementioned releasing lever 8 is turned around the rotation shaft 9 clockwise as viewed in FIG. 1. Further, the plurality of pin terminals 6 embedded in the aforementioned connector 4 are fit into a plurality of fitting holes (not shown) formed in the aforementioned PC Card 2, so that this PC Card 2 is held in the aforesaid slot main body 3 by the fitting force acting therebetween. Consequently, the fitting of the aforementioned PC Card 2 is completed. Moreover, to prevent the PC Card 2 from coming off the aforementioned connector 4 owing to vibrations or the like, the PC Card 2 is locked by operating coming-off preventing lock mechanisms such as the aforementioned operating knob 21. Namely, if the aforementioned lever operating stick 20 is in the first lock releasing position, the operating knob 21 is turned counterclockwise by 90 degrees. In contrast, if the aforementioned lever operating stick 20 is in the second lock releasing position, the operating knob 21 is turned clockwise by 90 degrees. Furthermore, when the aforementioned operating knob 21 is pushed in such a position to thereby push the aforesaid lever operating stick backwardly, the lock portion 23 of the aforementioned operating knob 21 abuts against the front upper right corner portion of the aforementioned PC Card 2, as illustrated in FIGS. 6 and 7. In this position, the aforesaid stopper spring 36 engages the aforementioned lock holding step portion 32, so that the locking of the PC Card 2 is completed. As shown in FIG. 7, the lock portion 23 of the aforementioned operating knob 21 is formed in such a manner as to have a size sufficient to the extent that the lock portion 23 can abut against both of two PC Cards 2 respectively fit into the upper slot main body 3a and the lower slot main body 3b. Therefore, a plurality of PC Cards 2 can be easily locked by the single operating knob 21.

Next, the case, in which the coming-off preventing lock of the PC Card 2 is canceled and the PC Card 2 is removed from the PC Card slot 1, will be described by referring to FIGS. 10 through 19.

Figure 10:
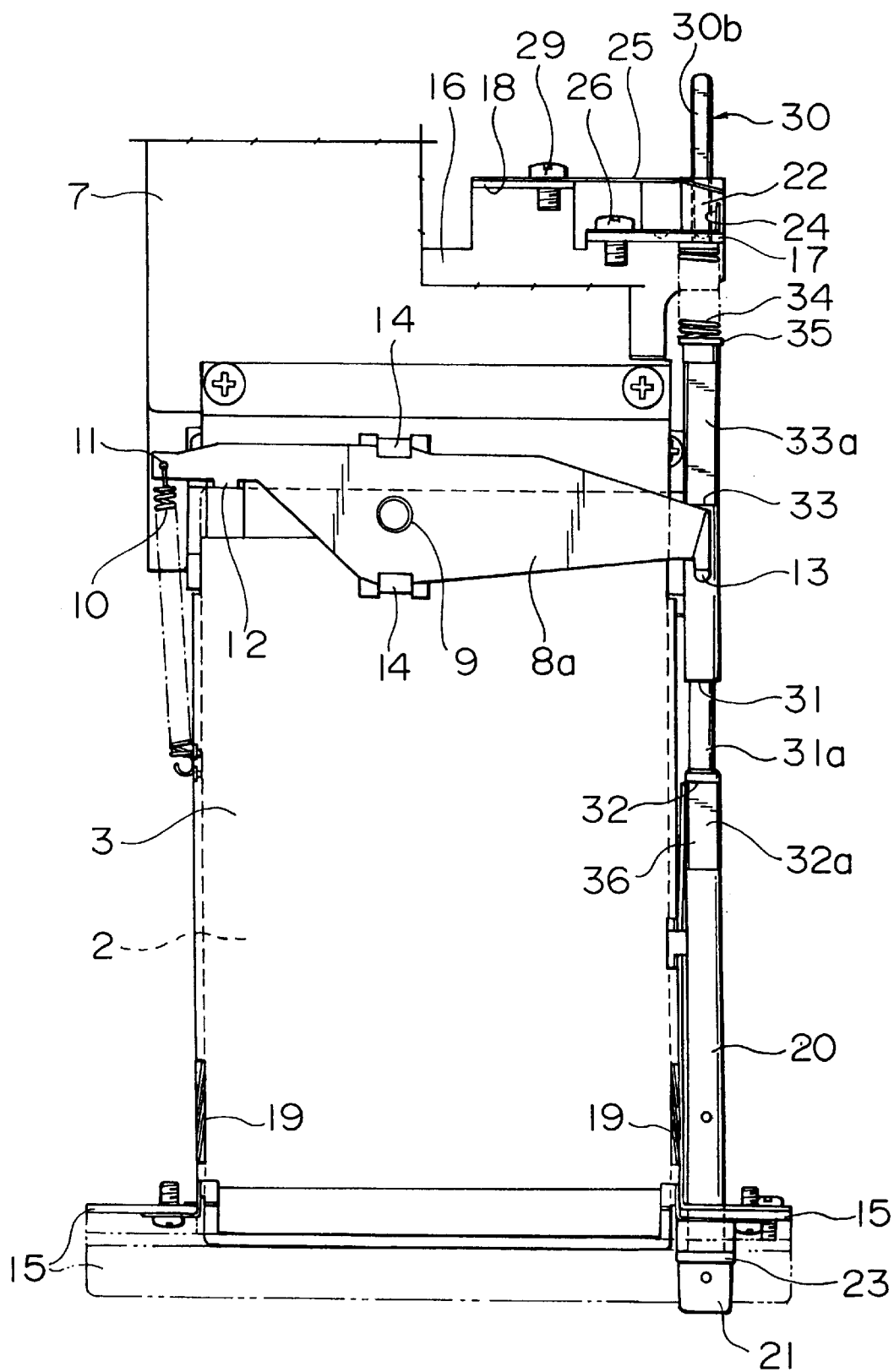
FIG. 10 is a plan view of the PC Card slot of the present invention, illustrating a condition of this embodiment of the present invention, in which a PC Card is fit into the slot main body and in which the lever operating stick is in a first lock releasing or canceling position.
Figure 11:
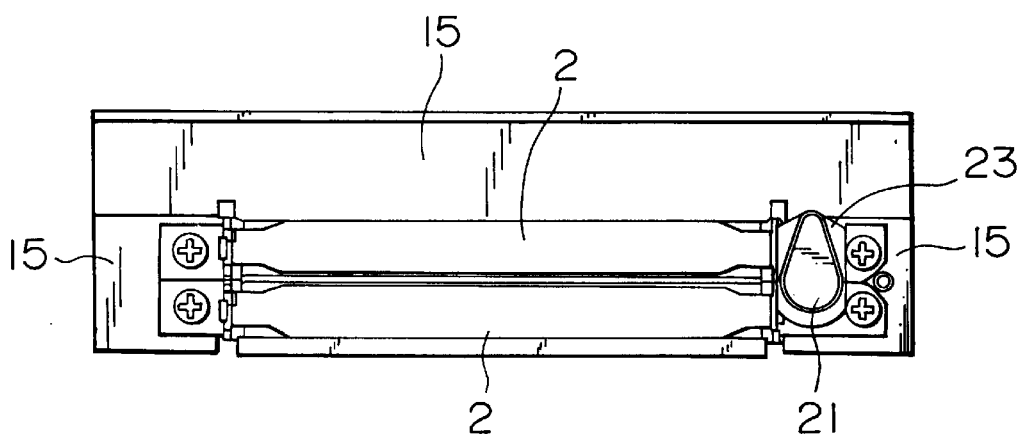
FIG. 11 is a front view of the PC Card slot in the condition as illustrated in FIG. 10.
Figure 12:
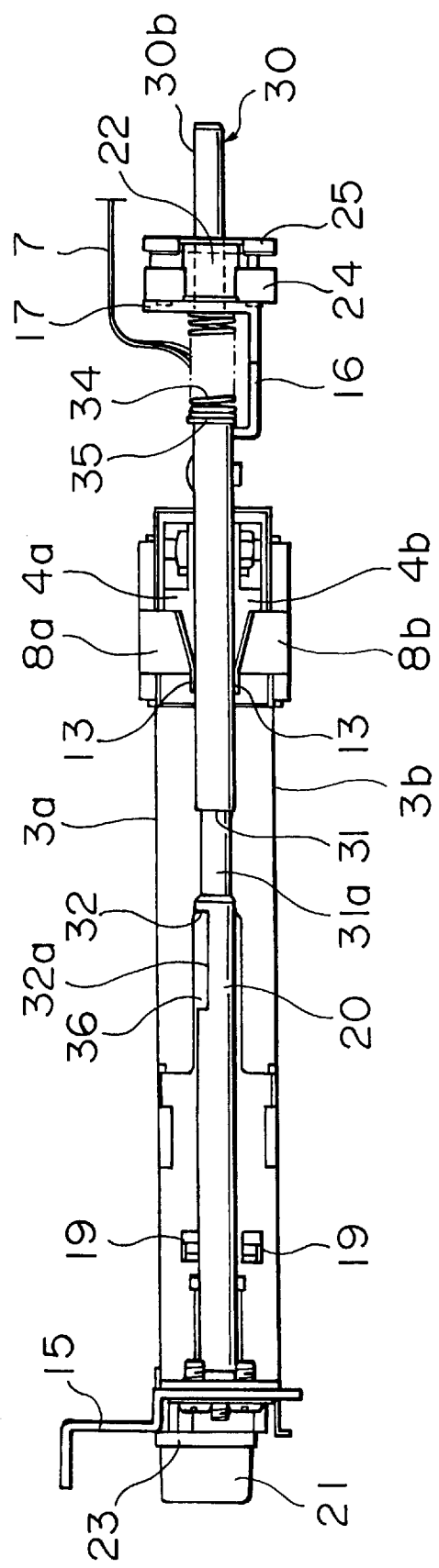
FIG. 12 is a right side view of the PC Card slot in the condition as illustrated in FIG. 10.
Figure 13:
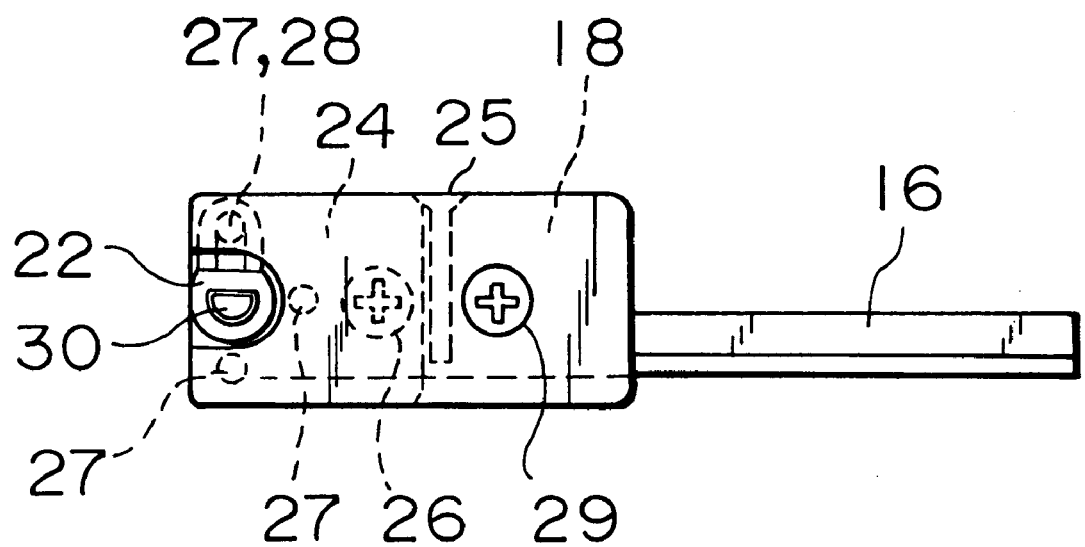
FIG. 13 is a rear view of the PC Card slot in the condition as illustrated in FIG. 10.

FIGS. 10 to 13 illustrate the case that the PC Card 2 is fit into the PC Card slot 1 and the lever operating stick 20 is turned to the first lock releasing position. FIG. 10 is a plan view of such a PC Card slot at that time. FIG. 11 is a front view of the PC Card slot in the condition as illustrated in FIG. 10. FIG. 12 is a right side view of the PC Card slot in the condition as illustrated in FIG. 10. FIG. 13 is a rear view of the PC Card slot in the condition as illustrated in FIG. 10.

Figure 14:
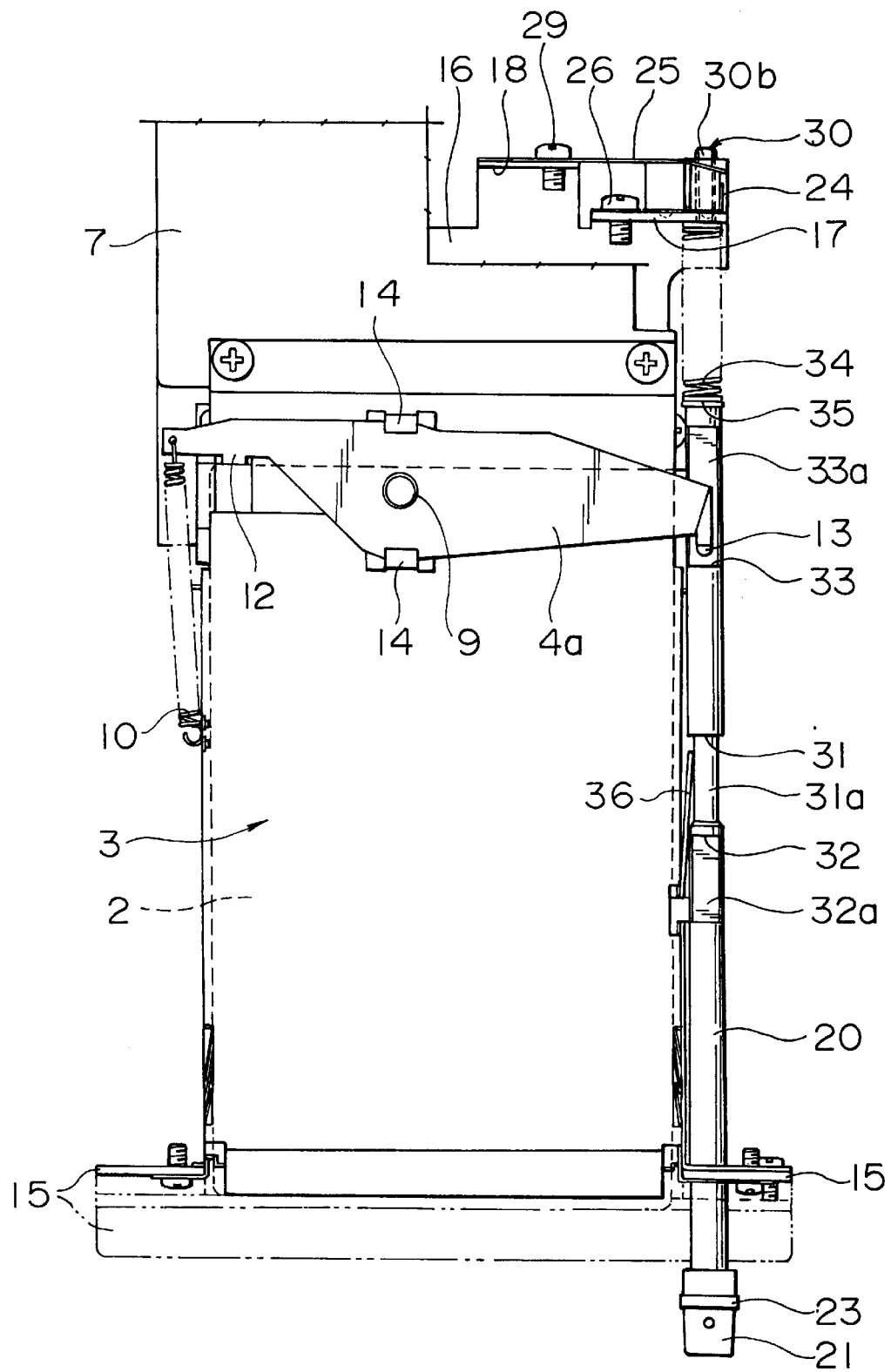
FIG. 14 is a plan view of the PC Card slot of the present invention, illustrating a condition of this embodiment of the present invention, in which a PC Card is fit into the slot main body and in which the lever operating stick is drawn out of the first lock releasing position.
Figure 15:
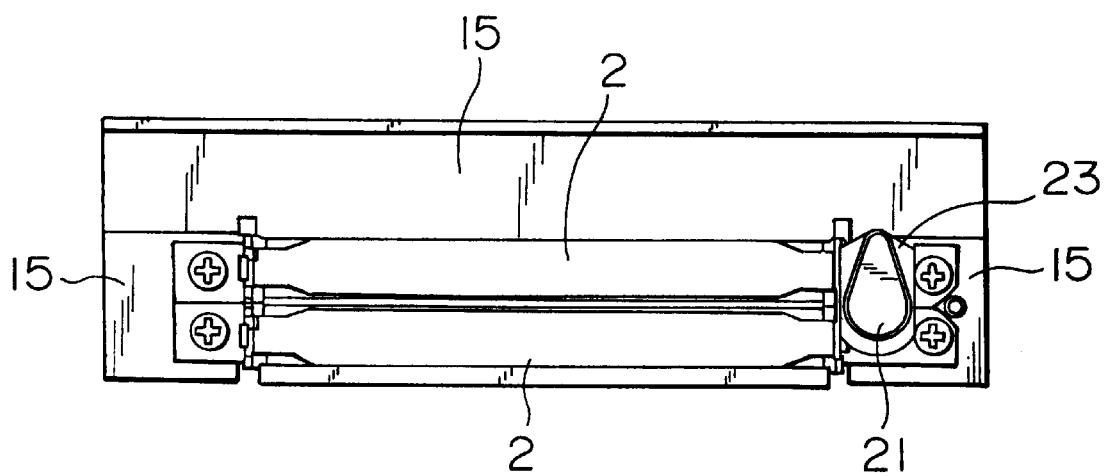
FIG. 15 is a front view of the PC Card slot in the condition as illustrated in FIG. 14.
Figure 16:
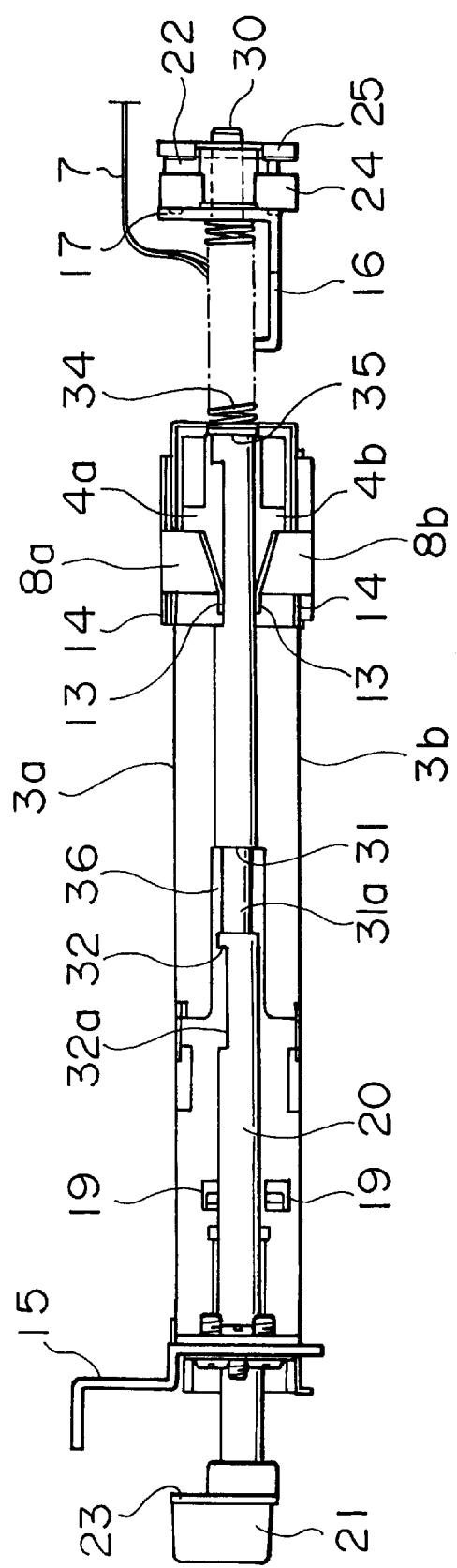
FIG. 16 is a right side view of the PC Card slot in the condition as illustrated in FIG. 14.

Further, FIGS. 14 to 16 illustrate the state of the PC Card slot, in which the lever operating stick 20 is drawn out (namely, is projected to a user) from the slot, which has been in the first lock releasing position illustrated in FIGS. 10 to 13. FIG. 14 is a plan view of such a PC Card slot at that time. FIG. 15 is a front view of the PC Card slot in the condition as illustrated in FIG. 14. FIG. 16 is a right side view of the PC Card slot in the condition as illustrated in FIG. 14.

Figure 17:
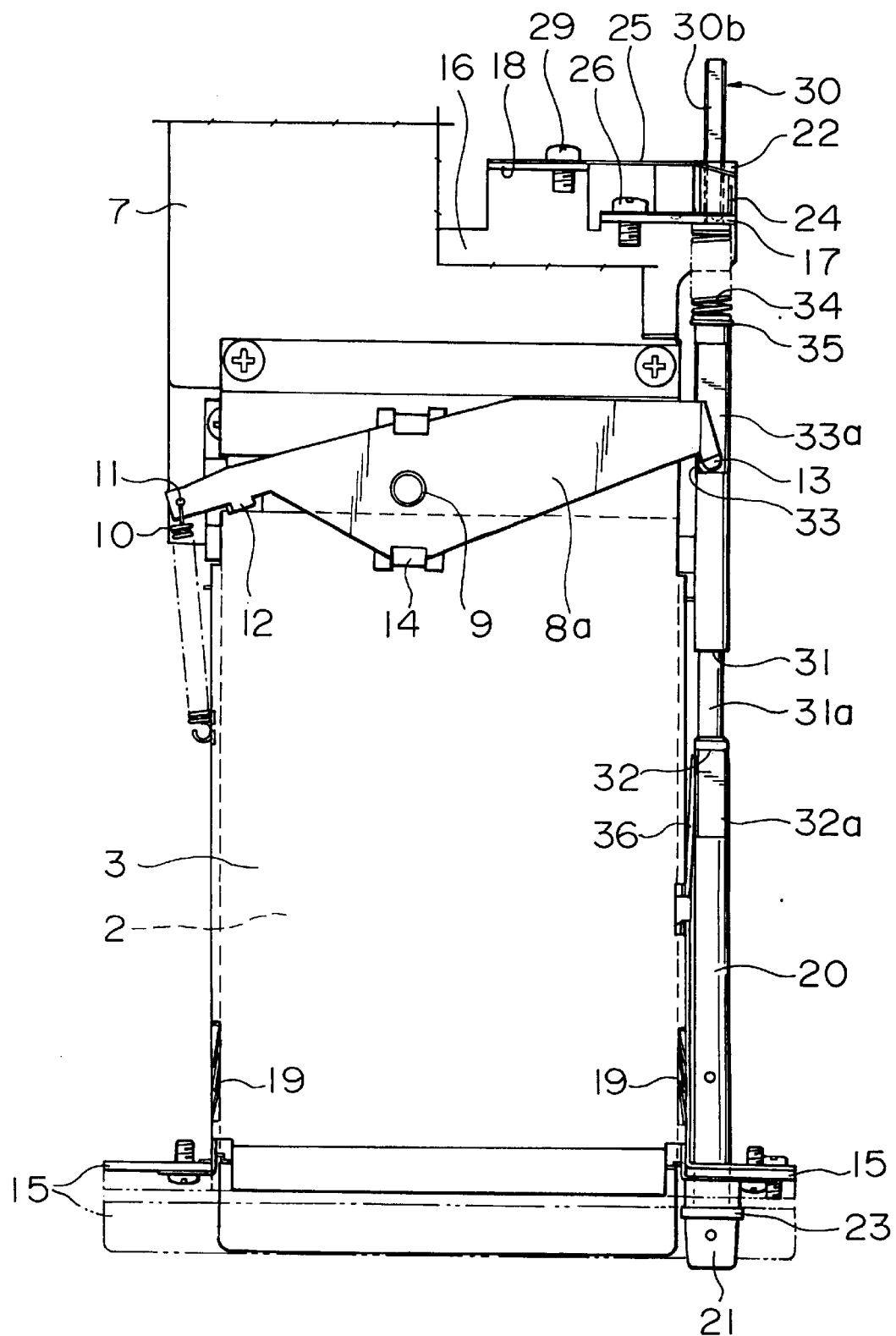
FIG. 17 is a plan view of the PC Card slot of the present invention, illustrating a condition of this embodiment of the present invention, in which a PC Card is drawn out of the slot main body.
Figure 18:
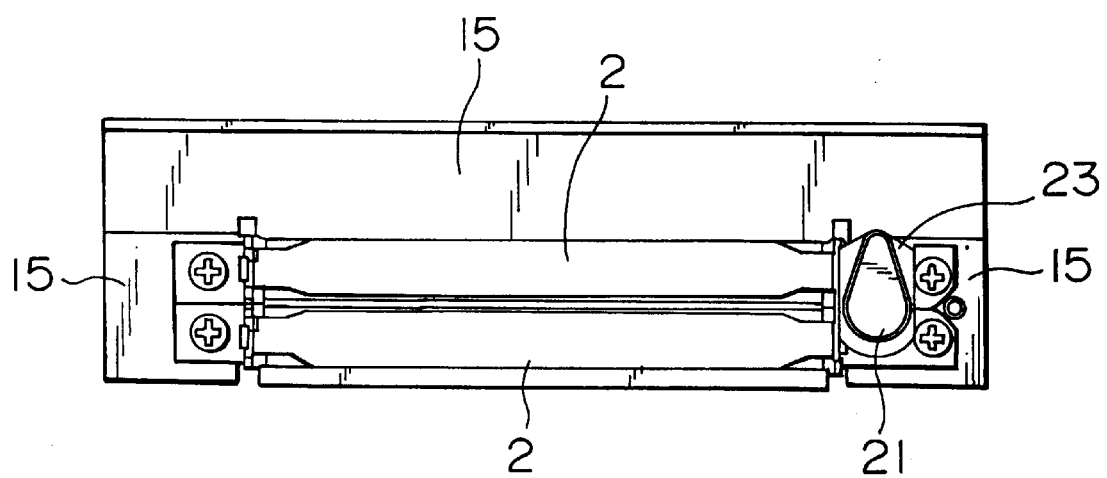
FIG. 18 is a front view of the PC Card slot in the condition as illustrated in FIG. 17.
Figure 19:
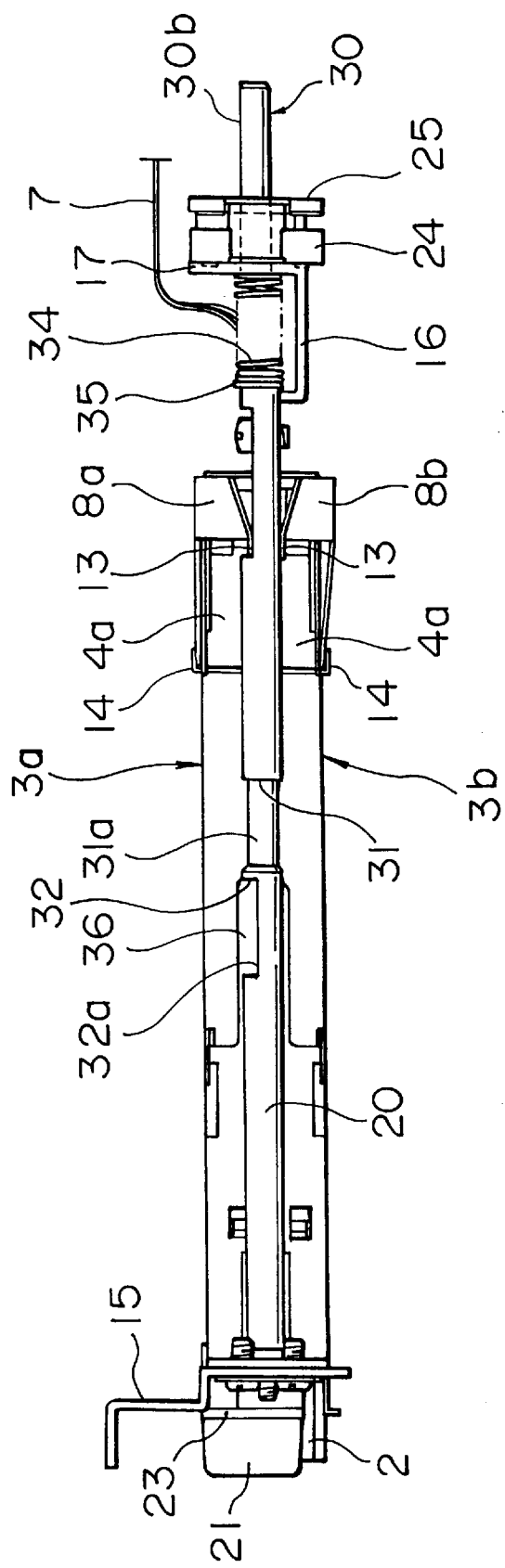
FIG. 19 is a right side view of the PC Card slot in the condition as illustrated in FIG. 17.
Figure 20:
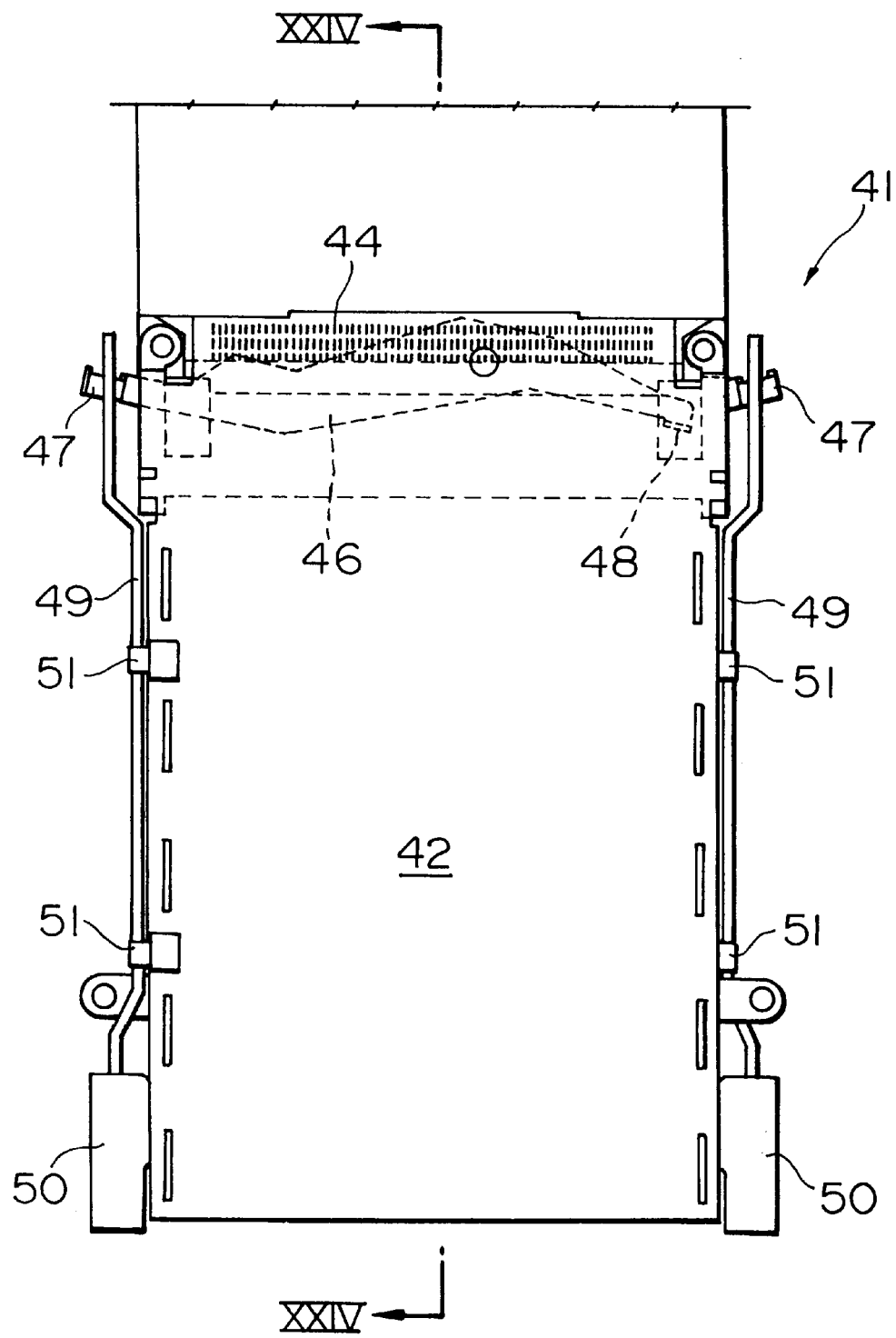
FIG. 20 is a plan view of the conventional PC Card slot.
Figure 21:
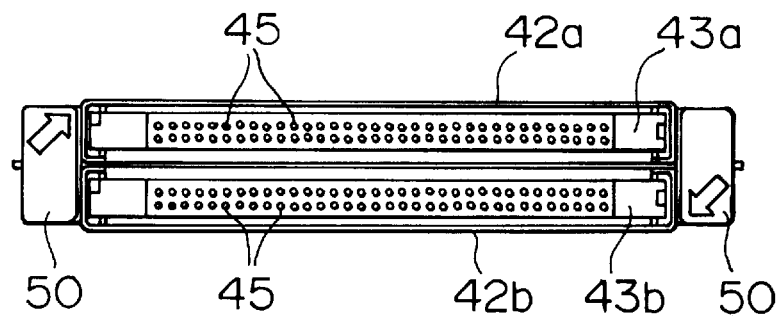
FIG. 21 is a front view of the conventional PC Card slot in the condition as illustrated in FIG. 20.
Figure 22:
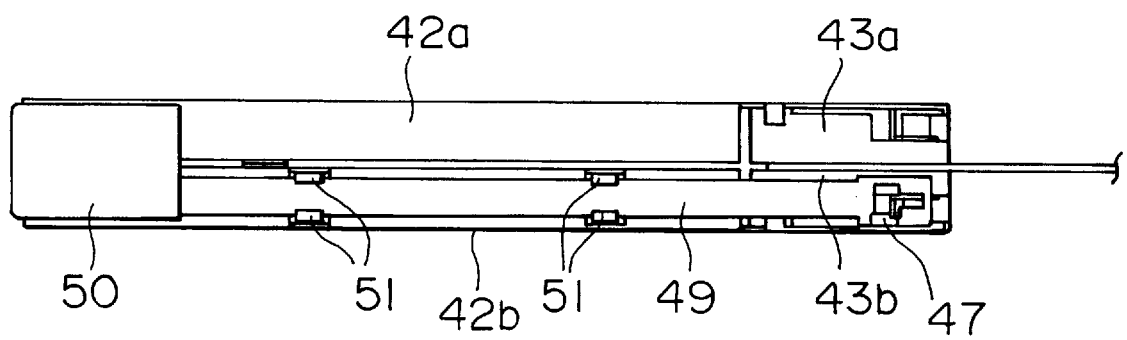
FIG. 22 is a right side view of the conventional PC Card slot in the condition as illustrated in FIG. 20.
Figure 23:
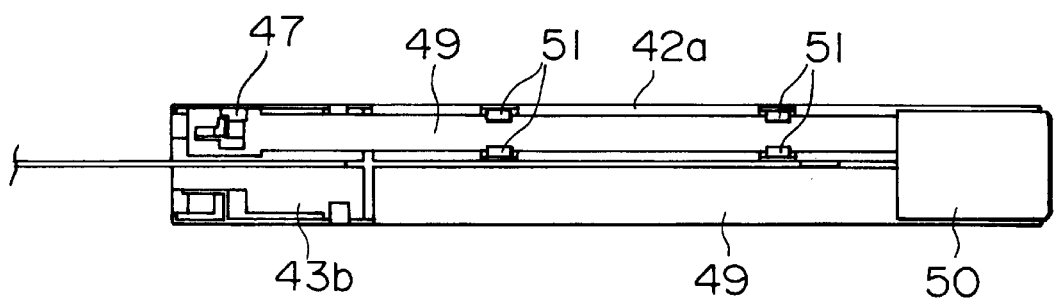
FIG. 23 is a left side view of the conventional PC Card slot in the condition as illustrated in FIG. 20.
Figure 24:
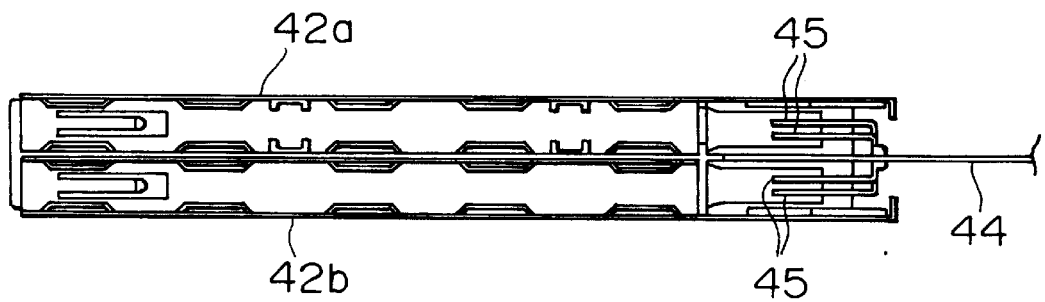
FIG. 24 is a sectional view taken on line XXIV—XXIV of FIG. 20.
Figure 25:
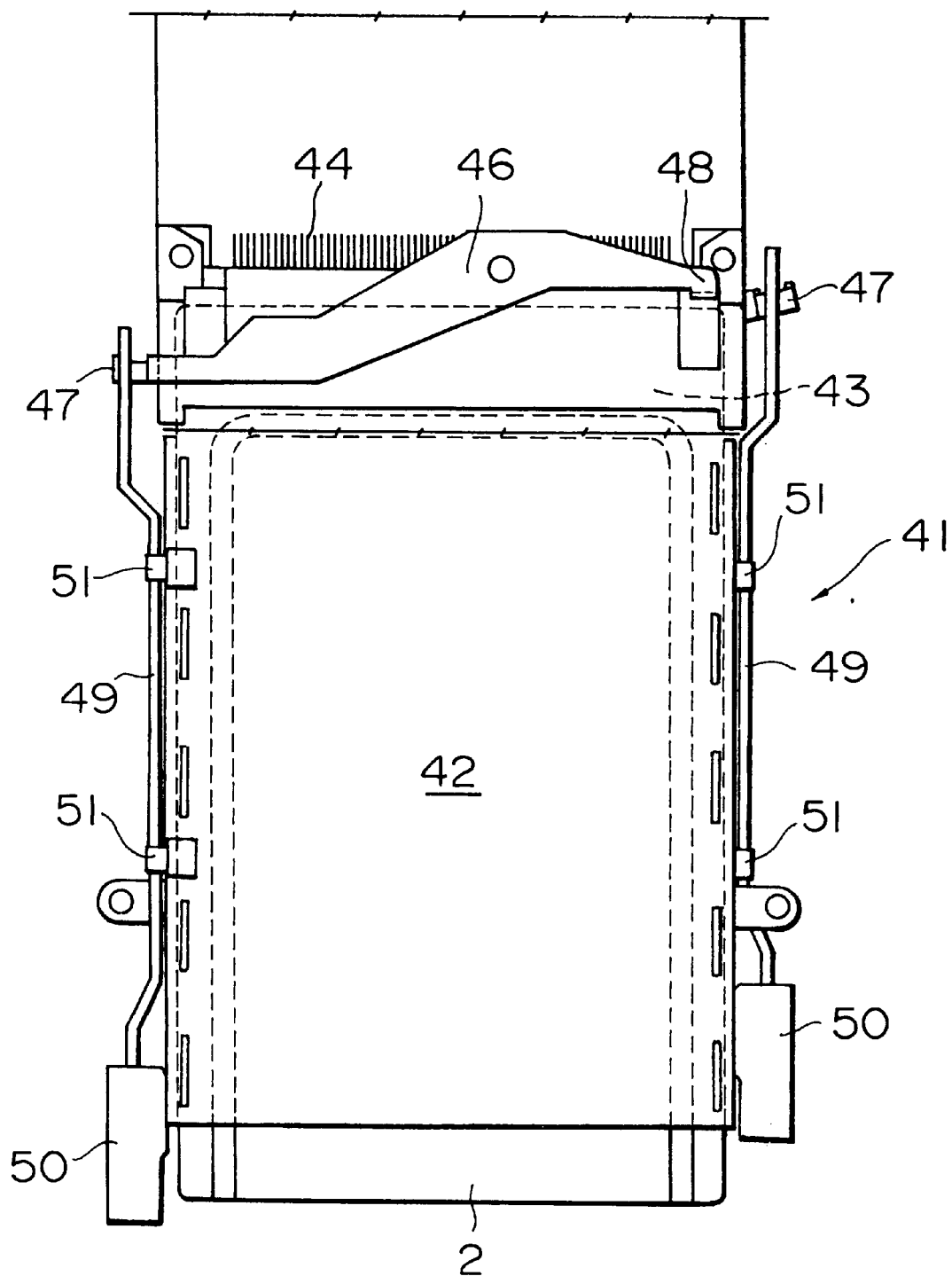
FIG. 25 is a plan view of the conventional PC Card slot, illustrating a condition thereof in which a PC Card is fit thereinto.
Figure 26:
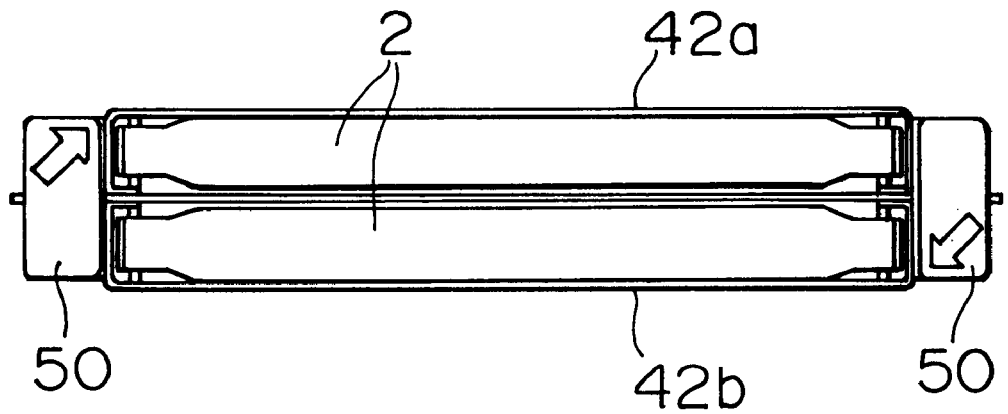
FIG. 26 is a front view of the conventional PC Card slot of FIG. 25.
Figure 27:
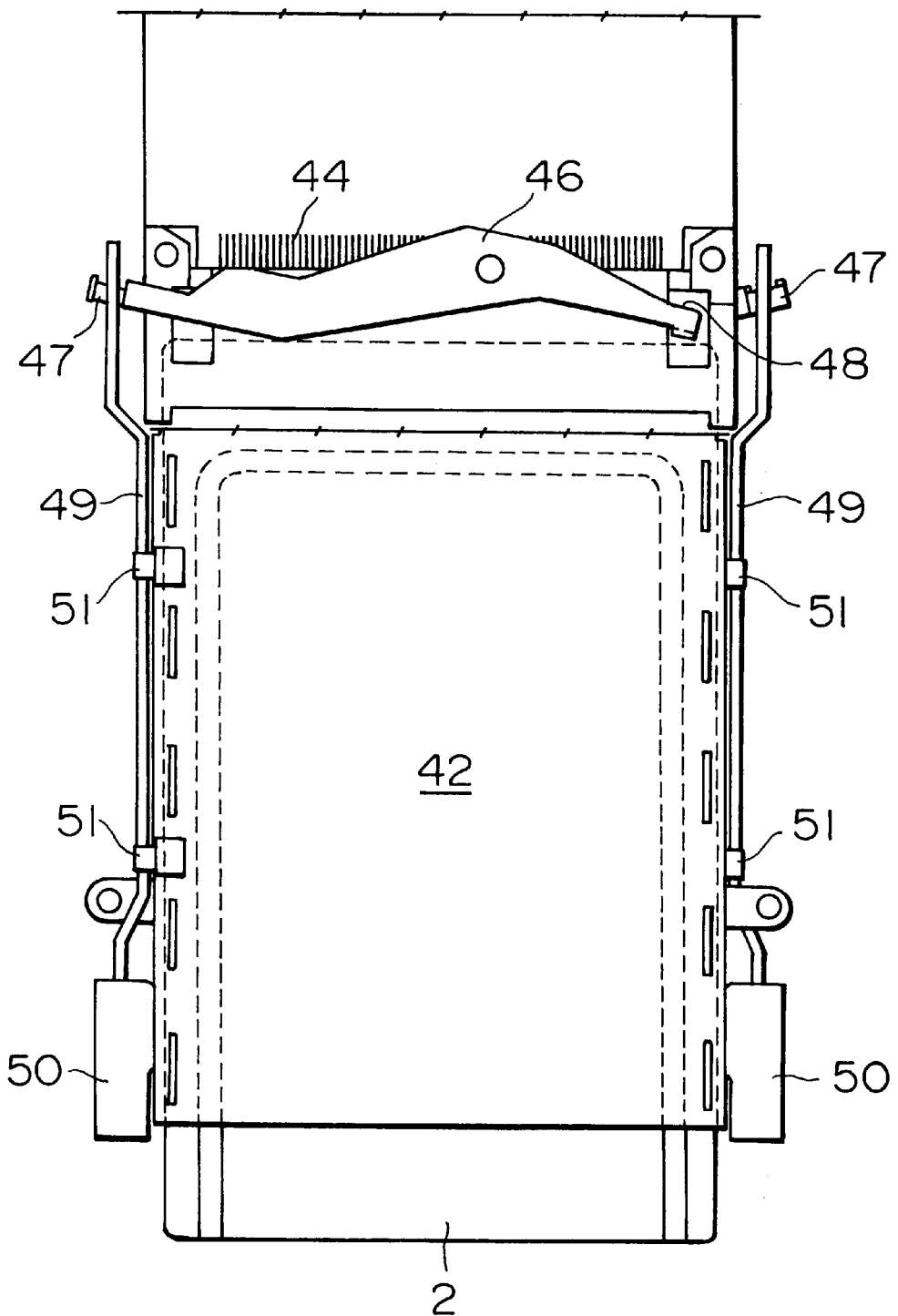
FIG. 27 is a plan view of the conventional PC Card slot, illustrating a condition thereof in which a PC Card is drawn out therefrom.

Moreover, FIGS. 17 to 19 illustrate the state of the PC Card slot, in which the lever operating stick 20 is pushed when the slot is in the condition illustrated in FIGS. 14 to 16. FIG. 17 is a plan view of such a PC Card slot at that time. FIG. 18 is a front view of the PC Card slot in the condition as illustrated in FIG. 17. FIG. 19 is a right side view of the PC Card slot in the condition as illustrated in FIG. 17.

In the case of releasing the PC Card 2 from the locked state, for example, in the case of releasing the PC Card 2, which has been fit into the upper connector 4a, from the locked state, the aforementioned operating knob 21 is turned clockwise as illustrated in FIG. 11. Thereby, the aforementioned lever operating stick 20 is turned, so that the engagement between the aforementioned lock holding step portion 32 and the aforesaid stopper spring 36 is canceled. Consequently, the aforementioned lever operating stick 20 comes to be able to move freely in the axial direction.

When the PC Card 2 is released from the locked state, the aforementioned lever operating stick 20 is moved by the pushing force of the aforementioned coil spring 34, which is wound around the rotation restricting flat portion 30, with great impetus to the front of the slot. As illustrated in FIGS. 14 to 16, the aforementioned stopper spring 36 abuts against the stick coming-off preventing step portion 31 of the aforementioned lever operating stick 20 and then stops.

Operations of the turning of the aforementioned operating knob 21 to the movement of the aforementioned lever operating stick 20 are performed consecutively. In this state, the aforesaid upper releasing lever 8a is selected simultaneously. Namely, the slot is in the state in which the lever operating step portion 33 of the aforementioned lever operating stick faces the aforementioned upper releasing lever 8a.

Further, when the aforementioned lever operating stick 20 is pushed backwardly again during being in such a state, the lever operating step portion 33 of this lever operating stick 20 pushes the pushing portion 13 of the aforesaid upper releasing lever 8a and further turns the aforementioned upper releasing lever 8a counterclockwise. As this upper releasing lever 8a is turned, the abutting portion 12 pushes a corner portion (namely, the upper left corner portion as viewed in FIG. 17) of the aforementioned PC Card 2 to the front of the slot, so that the fitting force acting between the PC Card 2 and the set of the pin terminals 6 of the aforesaid connector 4 is canceled. Then, as a result of application of the pushing force of the coil spring 10 for the lever, the aforementioned PC Card 2 pops or leaps out from the aforesaid upper slot main body 3a to the user by a proper extent. Thus, the user removes the aforementioned PC Card 2, which has leaped out thereto by a proper extent, from the aforesaid upper slot main body 3a by grasping this PC Card 2.

In contrast, in the case that the aforementioned PC Card 2 is removed from the aforesaid lower slot main body 3b subsequently, the aforementioned lever operating stick 20 is turned counterclockwise by 180 degrees, as viewed in FIG. 18, from the first lock releasing position to the second lock releasing position. From this position, the lever operating stick 20 is pushed backwardly against the pressing force of the coil spring 34 for the stick. Thereafter, the aforementioned PC Card 2 is removed from the lower slot main body 3b by performing an operation similar to that of removing the PC Card 2 from the aforementioned upper slot main body 3a. Namely, the lever operating step portion 33 of the aforementioned lever operating stick 20 pushes the pushing portion 13 of the aforesaid lower releasing lever 8b to thereby turn the lower releasing lever 8b counterclockwise. By this turn, the abutting portion 12 of the aforementioned lower releasing lever 8b pushes the corner portion of the aforementioned PC Card 2, so that the fitting force acting between the aforesaid PC Card 2 and the set of the pin terminals 6 of the aforementioned lower connector is canceled. In addition to this, the pushing force of the aforesaid coil spring 10 for the lever is applied thereto. Thus, when the aforementioned PC Card 2 pops out of the aforementioned lower slot main body 3b, the user removes the PC Card 2 therefrom.

Therefore, in accordance with the embodiment of the present invention, the PC Card slot 1 itself is provide with a lock mechanism for preventing the PC Card 2 from coming off the slot 1 after the PC Card 2 is fit thereinto. Consequently, the efficiency in assembling the device is enhanced.

Furthermore, the releasing of the aforementioned lock mechanism from the locked state can be performed simultaneously with the selection of the releasing lever 8 so as to remove the PC Card 2 by turning the aforementioned lever operating stick 20. Consequently, the operability of the PC Card slot is extremely improved.

Additionally, the operating knob 21 further serves as the lock mechanism. Thereby, users are prevented from forgetting to lock the PC Card 2 after fit into the slot and to release the PC Card 2 from the locked state. Consequently, evil effects caused when forgetting to lock the PC Card 2 and to release the PC Card 2 from the locked state, namely, problems, for example, the problem in that the PC Card 2 is pulled during locked in the slot, are prevented from occurring.

Furthermore, the operating knob 21 of the lever operating stick 20 of this embodiment is adapted to protrude to a user by the action of the coil spring 34 for the stick when canceling the fitting force acting between the PC Card 2 and the set of the pin terminals 6 of the connector 4. This results in elimination of the need for operating the PC Card in the inner part of the slot. Thus, there is no necessity of forming a large space so as to facilitate an operation of the operating knob 21, differently from the conventional PC Card slot. Consequently, the size of the PC Card slot (and thus the size of the device) can be further decreased.

Furthermore, this embodiment is adapted so that the PC Card 2 leaps out to a user by the pressing force of the coil spring 10 for the lever when removing the PC Card 2 from the slot main body. This facilitates the removal of this PC Card 2 from the slot.

Although the preferred embodiment of the present invention has been described above, it should be understood that the present invention is not limited thereto and that other modifications will be made by those skilled in the art, as needed, without departing from the spirit of the invention. For instance, in the foregoing description of the aforementioned embodiment, the PC Card slot 1, into which two PC Cards can be fit, has been described. However, even in the case of PC Card slots 1 into which three or more PC Cards 2 can be fit, advantageous effects similar to those of this embodiment can be obtained by forming a large lock portion 23 of the operating knob 21, or modifying the shape of this lock portion in such a manner that this lock portion can abut against each of the PC Cards 2, or altering the lock releasing positions of the aforementioned lever operating stick 20, which respectively correspond to the PC Cards 2, according to the number of the PC Cards 2.

As above described, in accordance with the PC Card slot of the present invention, a lock mechanism for preventing the PC Card from coming off the slot after fitting the PC Card is provided in the operating knob. Thus, a locking operation for preventing a plurality of PC Cards from coming off the slot and a releasing operation for removing each PC Card are performed by the single lever operating stick. Thereby, the locking operation of locking the PC Card and the releasing operation of releasing the PC Card from the locked state can be easily achieved. Moreover, the safety and the assembly efficiency of the device can be enhanced.

The scope of the present invention, therefore, should be determined solely by the appended claims.

What is claimed is:

1. A PC connector device provided with a slot main body having one or more storage cavities, into each of which a PC Card is fit, said slot main body comprising:

one or more connectors each for holding said PC Cards; a plurality of releasing levers each for pushing said PC Cards to thereby separate said PC Cards from said connectors; a single lever operating stick having a locked position and an unlocked position for turning said plurality of releasing lever;

an operating knob provided on said single lever operating stick; and a lock portion formed on said operating knob in such a manner as to be able to abut against said PC Cards so as to prevent said PC Cards from coming off said connectors.

2. The PC connector device according to claim 1, wherein a plurality of said storage cavities are formed in said slot main body so that a plurality of PC Cards are able to be fit thereinto, a plurality of said releasing levers respectively corresponding to the plurality of the storage cavities are attached to said main body, wherein said PC Cards are separated from said connectors by said single lever operating stick; and wherein said PC Cards are locked by said single operating knob so as to prevent each of said PC Cards from coming off said connectors.

3. The PC connector device according to claim 2, wherein an engaging portion being capable of selectively engaging with each of said releasing levers is formed on said single lever operating stick, and wherein said engaging portion is engaged with one of said releasing levers by turning said single lever operating stick.

4. The PC connector device according to claim 3, wherein cancellation of locking of said lock mechanism and selection of said releasing lever are simultaneously performed by turning said single lever operating stick.

5. The PC connector device according to claim 1, wherein a stopper for holding said single lever operating stick in a lock position, and a spring member for pushing said single lever operating stick to a front of said slot main body while said single lever operating stick is not restrained by said stopper, are provided in said slot main body, wherein when said lock portion formed on said operating knob is in a position, in which said lock portion is able to lock said PC Card in a direction of circumference of said single lever operating stick, and when said lock portion locks said PC Card, said stopper is engaged with said single lever operating stick by pushing and retreating said operating knob, and wherein when unlocking said PC Card, said operating knob is protruded to an operating face by a resilient force of said spring member.

* * * * *